(12) United States Patent
Tanaka

(10) Patent No.: US 8,179,207 B2
(45) Date of Patent: May 15, 2012

(54) RESONATOR DEVICE, FILTER INCLUDING THE SAME, AND DUPLEXER

(75) Inventor: Nobuhira Tanaka, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 307 days.

(21) Appl. No.: 12/492,271

(22) Filed: Jun. 26, 2009

(65) Prior Publication Data

US 2009/0322444 A1 Dec. 31, 2009

(30) Foreign Application Priority Data

Jun. 30, 2008 (JP) ................................ 2008-170566

(51) Int. Cl.
*H03H 9/70* (2006.01)
*H03H 9/54* (2006.01)
*H03H 9/64* (2006.01)

(52) U.S. Cl. .................... 333/133; 333/189; 333/193

(58) Field of Classification Search ............ 333/133, 333/189, 193–196, 126, 129, 132, 167, 168, 333/175, 176, 186; 455/78, 82
See application file for complete search history.

(56) References Cited

U.S. PATENT DOCUMENTS

| | | | | | |
|---|---|---|---|---|---|
| 2,222,417 | A | * | 11/1940 | Mason | 333/190 |
| 3,973,149 | A | * | 8/1976 | Vale et al. | 310/360 |
| 5,933,062 | A | * | 8/1999 | Kommrusch | 333/193 |
| 7,030,718 | B1 | * | 4/2006 | Scherer | 333/188 |
| 7,683,736 | B2 | * | 3/2010 | Inoue et al. | 333/133 |
| 2002/0140519 | A1 | | 10/2002 | Takayama et al. | |
| 2003/0214368 | A1 | | 11/2003 | Taniguchi | |
| 2004/0227585 | A1 | | 11/2004 | Taniguchi et al. | |
| 2007/0024392 | A1 | | 2/2007 | Inoue et al. | |

FOREIGN PATENT DOCUMENTS

| | | |
|---|---|---|
| JP | 2001-285025 A | 10/2001 |
| JP | 2003-332885 A | 11/2003 |
| JP | 2007-036856 A | 2/2007 |
| WO | 99/23757 A1 | 5/1999 |
| WO | 2004/102798 A1 | 11/2004 |

OTHER PUBLICATIONS

Official Communication issued in corresponding Japanese Patent Application No. 2008-170566, mailed on Apr. 20, 2010.
Official Communication issued in corresponding Japanese Patent Application No. 2008-170566, mailed on Jun. 29, 2010.
Official Communication issued in corresponding European Patent Application No. 09164164.7, mailed on Aug. 4, 2010.

* cited by examiner

*Primary Examiner* — Barbara Summons
(74) *Attorney, Agent, or Firm* — Keating & Bennett, LLP

(57) ABSTRACT

A resonator device includes a plurality of resonators which are connected in series. An inductor and a capacitor are connected in parallel with at least one of the plurality of resonators. At least another one of the plurality of resonators has no inductor or capacitor connected in parallel therewith. Therefore, a sufficiently large attenuation outside the passband can be attained when the resonator device is used in a filter. Furthermore, the resonator device can be reduced in size.

4 Claims, 10 Drawing Sheets

RESONATOR DEVICE, FILTER INCLUDING THE SAME, AND DUPLEXER

BACKGROUND OF THE INVENTION

1. Field of the Invention

The present invention relates to a resonator device used for, for example, a band-pass filter of a portable information terminal, a filter including the resonator device, and a duplexer. More particularly, the present invention relates to a resonator device having a plurality of resonators connected in series, a filter including the resonator device, and a duplexer.

2. Description of the Related Art

Recently, with the development of mobile communication systems, the prevalence of portable information devices such as mobile phone devices has rapidly increased. Some portable information devices utilize a plurality of high-frequency bands. For example, mobile phone devices use a transmission (Tx) band (1850 to 1910 MHz) and a reception (Rx) band (1930 to 1990 MHz). A portable information device using a plurality of high-frequency bands, such as a mobile phone device, includes a device to prevent data interference, such as a high-frequency filter including a resonator device or an antenna duplexer including a high-frequency filter.

For example, Japanese Unexamined Patent Application Publication No. 2007-36856 discloses a resonator device used for a high-frequency filter. FIG. 9 is a diagram of a resonator device 100 disclosed in Japanese Unexamined Patent Application Publication No. 2007-36856. In the resonator device 100, an inductor 102 and a capacitor 103 are connected in parallel with a resonator 101. Thus, as shown in FIG. 10, a first anti-resonance point in a frequency range higher than a resonance frequency and a second anti-resonance point in a frequency range lower than the resonance frequency are defined. Further, the frequencies of the first and second anti-resonance points can be shifted to higher or lower frequencies by adjusting the inductance of the inductor 102 and the capacitance of the capacitor 103. Therefore, a filter including the resonator device 100 has improved design flexibility.

However, in a filter including the resonator device 100 disclosed in Japanese Unexamined Patent Application Publication No. 2007-36856, it is difficult to sufficiently increase the attenuation outside the passband. It is also difficult to reduce the size of the resonator device 100.

SUMMARY OF THE INVENTION

To overcome the problems described above, preferred embodiments of the present invention provide a resonator device that can be reduced in size and that is capable of sufficiently increasing the attenuation outside the passband when used in a filter, a filter including the resonator device, and a duplexer.

According to a preferred embodiment of the present invention, a resonator device includes a plurality of resonators connected in series, an inductor, and a capacitor, the inductor and the capacitor being connected in parallel with at least one resonator of the plurality of resonators. At least another one of the plurality of resonators, except for the at least one resonator, is not connected in parallel to an inductor or a capacitor.

According to another preferred embodiment of the present invention, a filter includes a resonator device according to a preferred embodiment of the present invention.

The filter may preferably be a ladder filter including the plurality of resonators as series arm resonators.

According to another preferred embodiment of the present invention, a duplexer includes a filter according to a preferred embodiment of the present invention, the filter being used as a transmitting filter.

The duplexer may preferably further include a wiring substrate including the inductor and a transmitting signal terminal of the transmitting filter, and a transmitting filter chip mounted on the wiring substrate preferably using flip-chip technology, for example. The transmitting filter chip may preferably include at least a portion of the transmitting filter including the plurality of resonators, and a filter-chip terminal connected to the transmitting signal terminal. The at least one resonator having the inductor and the capacitor connected in parallel therewith may preferably be directly connected to the filter-chip terminal.

In the resonator device according to a preferred embodiment of the present invention, at least one resonator among a plurality of resonators connected in series has an inductor and a capacitor connected in parallel therewith, and at least another one of the plurality of resonators has no inductor or capacitor connected in parallel therewith. Therefore, when the resonator device according to this preferred embodiment is used for a filter, the attenuation outside the passband can be sufficiently increased. Furthermore, the inductor can be reduced in size, and therefore the resonator device can also be reduced in size.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention will be described below with reference to the drawings.

Figure 1:
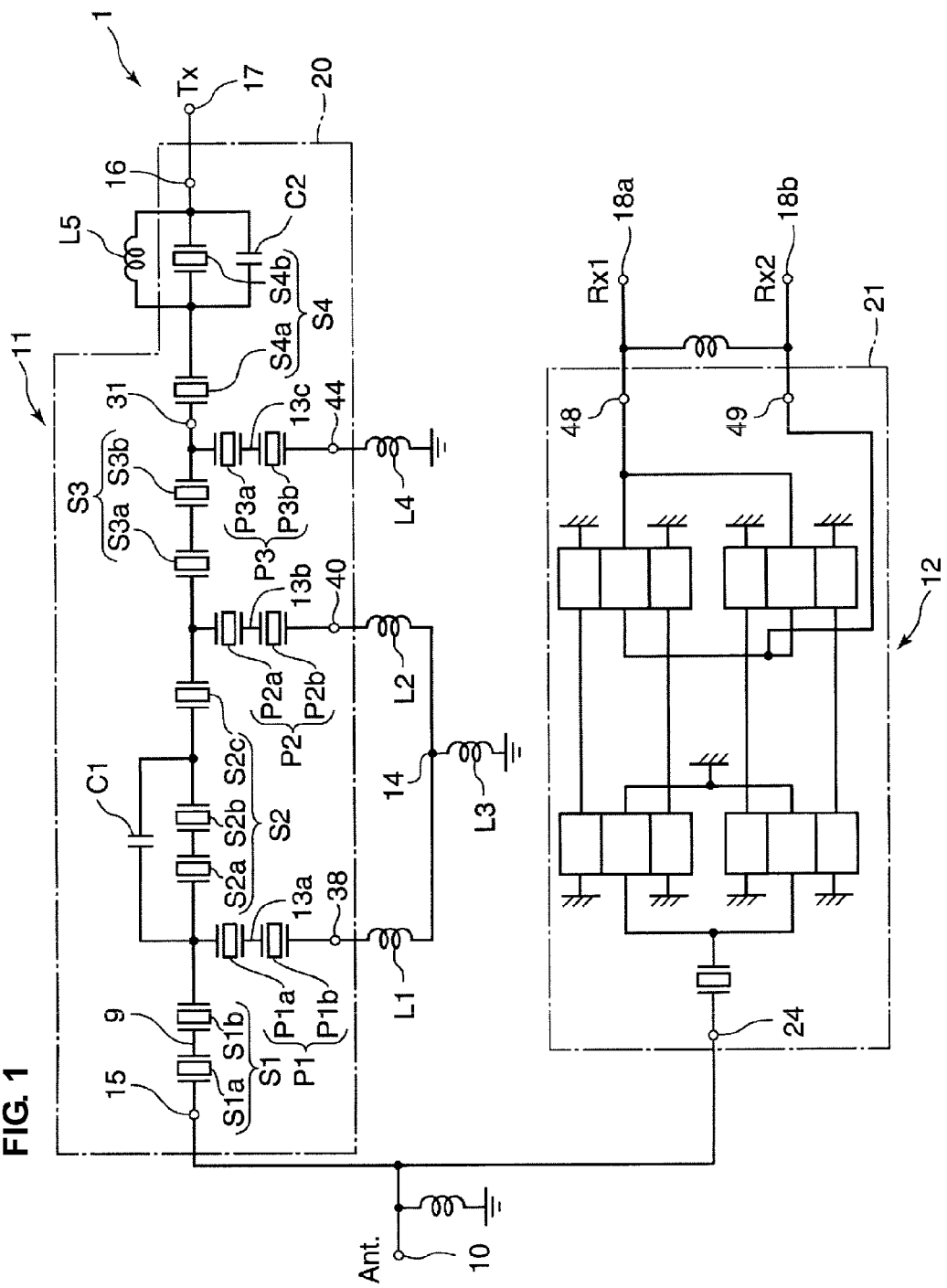
FIG. 1 is a circuit diagram of a duplexer according to a preferred embodiment of the present invention.

FIG. 1 is a circuit diagram of a duplexer 1 according to a preferred embodiment of the present invention. As shown in FIG. 1, the duplexer 1 includes a transmitting filter 11 and a receiving filter 12 which are connected to an antenna terminal 10.

The receiving filter 12 is connected to a pair of parallel terminals, namely, first and second receiving signal terminals 18a and 18b.

The transmitting filter 11 includes a series arm 9, and a plurality of parallel arms 13a to 13c connected between the series arm 9 and a ground potential. An input terminal 15 of the series arm 9 is connected to the antenna terminal 10. An output terminal 16 of the series arm 9 is connected to a transmitting signal terminal 17.

The series arm 9 includes series arm resonator devices S1, S2, S3, and S4. In the series arm 9, the series arm resonator devices S1, S2, S3, and S4 are connected in series.

In the present preferred embodiment, the series arm resonator device S1 has two resonators, namely, series arm resonators S1a and S1b, which are connected in series.

The series arm resonator device S2 has three resonators, namely, series arm resonators S2a, S2b, and S2c, which are connected in series. A capacitor C1 is connected in parallel with the series arm resonators S2a and S2b.

The series arm resonator device S3 has two resonators, namely, series arm resonators S3a and S3b, which are connected in series.

The series arm resonator device S4 has series arm resonators S4a and S4b which are connected in series. An inductor L5 and a capacitor C2 are connected in parallel with the series arm resonator S4b which is the closest to the output terminal 16. No inductor or capacitor is connected in parallel with the series arm resonator S4a which is closer to the input terminal 15 than the series arm resonator S4b.

The parallel arm 13a is provided with a parallel arm resonator device P1 and an inductor L1 in series. The parallel arm resonator device P1 has two resonators, namely, parallel arm resonators P1a and P1b, which are connected in series.

The parallel arm 13b is provided with a parallel arm resonator device P2 and an inductor L2 in series. The parallel arm resonator device P2 has two resonators, namely, parallel arm resonators P2a and P2, which are connected in series. The parallel arm 13a and the parallel arm 13b are commonly connected to a node 14. An inductor L3 is provided between the node 14 and the ground potential.

Further, the parallel arm 13c is provided with a parallel arm resonator device P3 and an inductor L4 in series. The parallel arm resonator device P3 has two resonators, namely, parallel arm resonators P3a and P3b, which are connected in series.

Each of the inductors L1 to L4 is preferably defined by a wiring pattern.

Each of the resonators S1a, S1b, S2a, S2b, S2c, S3a, S3b, S4a, and S4b is preferably defined by an elastic wave resonator that uses an elastic wave. The elastic wave used is not specifically limited. Examples of the elastic wave used may include a surface acoustic wave (SAW), a boundary elastic wave (BEW), and a bulk acoustic wave (BAW).

Specifically, in the present preferred embodiment, each of the resonators S1a, S1b, S2a, S2b, S2c, S3a, S3b, S4a, and S4b is preferably defined by a SAW resonator. Each of the resonators S1a, S1b, S2a, S2b, S2c, S3a, S3b, S4a, and S4b preferably includes a piezoelectric substrate and a dielectric layer defined on the piezoelectric substrate. Interdigital transducers (IDTs) are preferably located at boundaries between the piezoelectric substrates and the dielectric layers, and grating reflectors are located on either side of the IDTs. The piezoelectric substrates may be, for example, $LiNbO_3$ substrates with a cut angle of 126°. The dielectric layers may be made of, for example, $SiO_2$. When the normalized film thickness of a $SiO_2$ dielectric layer is less than about 0.4, a SAW is excited. The IDTs and the grating reflectors are preferably made of, for example, Al, Cu, Ni, Cr, and an alloy containing at least one of them as a primary component.

Figure 2:
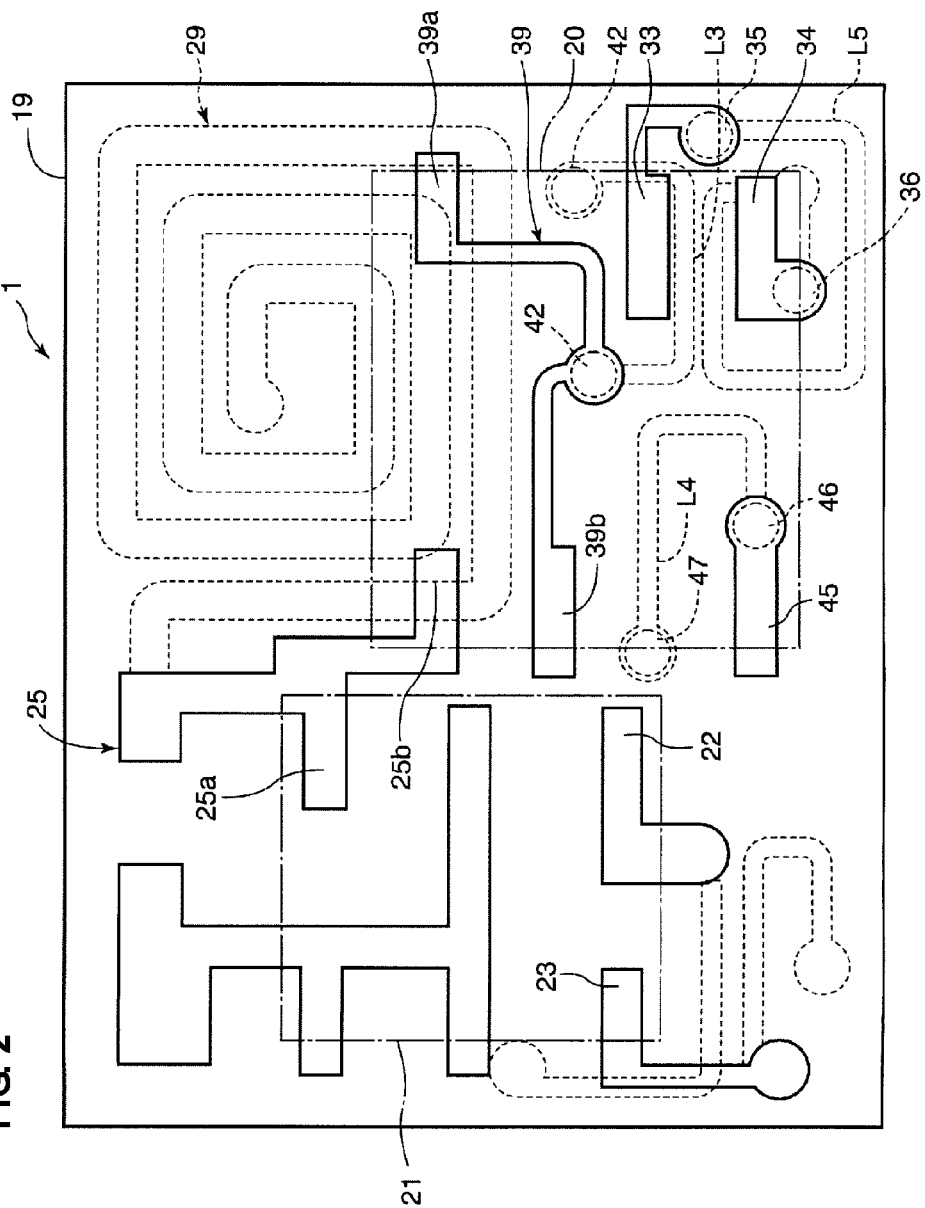
FIG. 2 is a schematic plan view of the duplexer shown in FIG. 1.

A specific structure of the duplexer 1 will now be described with reference to FIGS. 2 and 3. As shown in FIG. 2, the duplexer 1 includes a wiring substrate 19, a transmitting filter chip 20, and a receiving filter chip 21. The transmitting filter chip 20 and the receiving filter chip 21 are mounted on the wiring substrate 19 using flip-chip bonding. Note that the wiring substrate 19 has surface electrode patterns and internal electrode patterns. The surface electrode patterns are defined on a surface of the wiring substrate 19, and the internal electrode patterns are defined within the wiring substrate 19. In FIG. 2, the surface electrode patterns are indicated by solid lines and the internal electrode patterns are indicated by broken lines.

The receiving filter chip 21 is provided with the receiving filter 12 shown in FIG. 1. A terminal 48 of the receiving filter 12 shown in FIG. 1 is electrically connected to an electrode pad 22 (see FIG. 2) via a bump (not shown). The electrode pad 22 forms the receiving signal terminal 18a. A terminal 49 of the receiving filter 12 shown in FIG. 1 is electrically connected to an electrode pad 23 (see FIG. 2) via a bump (not shown). The electrode pad 23 forms the second receiving signal terminal 18b. Further, an input terminal 24 of the receiving filter 12 shown in FIG. 1 is electrically connected to a first end 25a of an electrode pad 25 (see FIG. 2) via a bump (not shown). The electrode pad 25 forms the antenna terminal 10.

Figure 3:
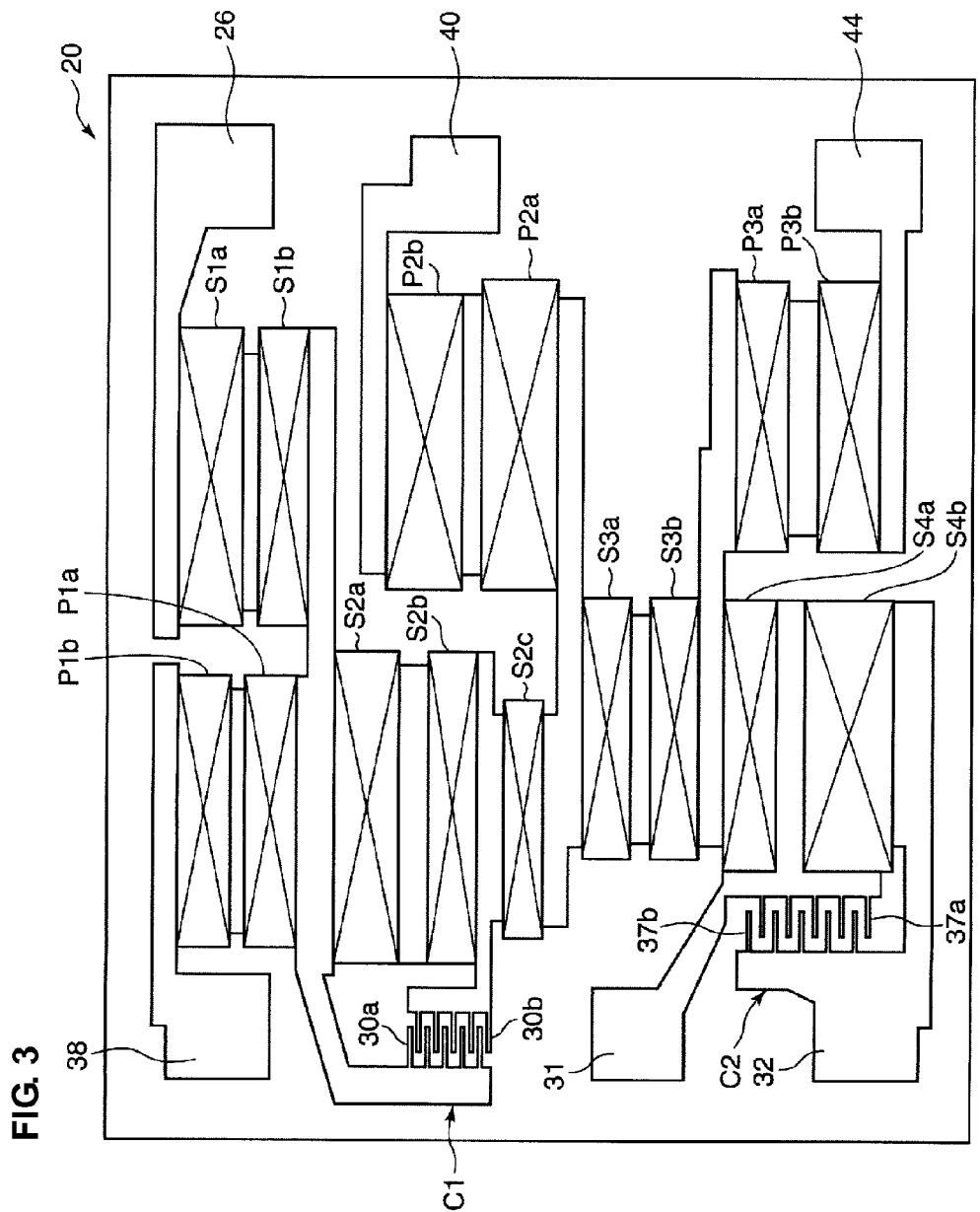
FIG. 3 is a schematic diagram showing a circuit structure of a transmitting filter chip in the duplexer according to a preferred embodiment of the present invention.

FIG. 3 is a schematic diagram showing a circuit structure of the transmitting filter chip 20. As shown in FIG. 3, components of the transmitting filter 11, except for the inductors L1 to L5, are defined. The transmitting filter chip 20 has a terminal 26 that is electrically connected to the series arm resonator S1a. The terminal 26 defines the input terminal 15 of the series arm 9 shown in FIG. 1. The terminal 26 is electrically connected to a second end 25b of the electrode pad 25 (see FIG. 2) that defines the antenna terminal 10 via a bump (not shown).

The capacitor C1 connected in parallel with the series arm resonators S2a and S2b preferably includes a pair of comb-shaped electrodes 30a and 30b. The comb-shaped electrodes 30a and 30b are provided on a surface of the piezoelectric substrate of the transmitting filter chip 20.

A terminal 31 is electrically connected to a node between the series arm resonators S4a and S3b. The terminal 31 is electrically connected to an electrode pad 33 shown in FIG. 2 via a bump (not shown). A terminal 32 is electrically connected to the series arm resonator S4b. The terminal 32 defines the output terminal 16 of the series arm 9 shown in FIG. 1. The terminal 32 is electrically connected to an electrode pad 34 shown in FIG. 2 via a bump (not shown). As shown in FIG. 2, the electrode pads 33 and 34 are electrically connected to the inductor L5, which is preferably defined by an internal electrode pattern connected through via-hole electrodes 35 and 36, respectively.

As shown in FIG. 3, comb-shaped electrodes 37a and 37b are provided on the surface of the piezoelectric substrate of the transmitting filter chip 20. The comb-shaped electrodes 37a and 37b define the capacitor C2.

The parallel arm resonator P1b is electrically connected to a terminal 38. The terminal 38 is electrically connected to a first end 39a of an electrode pad 39 shown in FIG. 2 via a bump (not shown). The parallel arm resonator P2b is electrically connected to a terminal 40. The terminal 40 is electrically connected to a second end 39b of the electrode pad 39 shown in FIG. 2 via a bump (not shown). As shown in FIG. 2, the electrode pad 39 is electrically connected to the inductance L3, which is preferably defined by an internal electrode pattern connected through a via-hole electrode 42. The inductor L3 is electrically connected to the ground potential through the via-hole electrode 42. The inductors L1 and L2 are preferably defined of the electrode pad 39.

As shown in FIG. 3, a terminal 44 is connected to the parallel arm resonator P3b. The terminal 44 is electrically connected to an electrode pad 45 shown in FIG. 2 via a bump (not shown). As shown in FIG. 2, the electrode pad 45 is electrically connected to the inductor L4, which is preferably defined by an internal electrode pattern connected through a via-hole electrode 46. The inductor L4 is electrically connected to the ground potential through a via-hole electrode 47.

Accordingly, in the present preferred embodiment, each of the inductor L5 and the capacitor C2 is connected in parallel with the series arm resonator S4b, but no inductor or capacitor is connected in parallel with the series arm resonator S4a. Thus, the series arm resonator S4b has a first anti-resonance point fa1 in a frequency range higher than a resonance frequency and a second anti-resonance point fa2 in a frequency range lower than the resonance frequency. In other words, with the provision of the series arm resonators S4a and S4b, two anti-resonance points are formed in a frequency range higher than the resonance frequency. Therefore, by changing the characteristics of the series arm resonators S4a and S4b, the filter characteristics of the transmitting filter 11 can be changed in various ways. In particular, in the series arm resonator S4b, the characteristics of the inductor L5 and capacitor C2 connected in parallel therewith are adjusted, whereby the frequency at the first anti-resonance point fa1 (high-frequency-side anti-resonance frequency) and the frequency at the second anti-resonance point fa2 (low-frequency-side anti-resonance frequency) can be flexibly adjusted while the resonance frequency is kept constant. Specifically, by increasing the inductance of the inductor L5, the high-frequency-side anti-resonance frequency and the low-frequency-side anti-resonance frequency can be shifted to higher frequencies. Further, by increasing the capacitance of the capacitor C2, the high-frequency-side anti-resonance frequency and the low-frequency-side anti-resonance frequency can be shifted to lower frequencies. Therefore, with the use of a resonator device including the series arm resonators S4a and S4b, the design flexibility of the transmitting filter 11 can be improved.

Further, the anti-resonance frequency of the series arm resonator S4a and the high-frequency-side anti-resonance frequency of the series arm resonator S4b are made different from each other. Therefore, the out-of-band attenuation characteristics in a high-frequency range of the passband can be improved.

Further, as described above, with the provision of the series arm resonator S4b, the second anti-resonance point fa2 in a frequency range lower than the resonance frequency is formed. Therefore, the out-of-band attenuation characteristics in a low-frequency range of the passband can also be improved as compared with that in a case where the series arm resonator S4b is not provided.

Accordingly, for example, in the present preferred embodiment, the resonator device S4 including the series arm resonators S4a and S4b, the inductor L5, and the capacitor C2 is used for the transmitting filter 11. The transmitting filter 11 can therefore achieve high attenuation in both bands, for example, in the Rx band (1930 to 1990 MHz) in a frequency range higher than the Tx band (1850 to 1910 MHz) and in the GPS band (1550 to 1600 MHz) in a frequency range lower than the Tx band.

Further, since the series arm resonator S4a is provided between the series arm resonator S4b which is the closest to the output terminal 16 of the series arm 9 and the node between the parallel arm 13c which is the closest to the output terminal 16 and the series arm 9, the inductance of the inductor L5 can be reduced. Therefore, the inductor L5, and therefore the transmitting filter 11, can be reduced in size. Consequently, the duplexer 1 can be reduced in size.

Note that, for example, in a case where another series arm resonator is connected between the series arm resonator S4b and the output terminal 16 of the series arm 9, the transmitting filter chip 20 needs to be provided with, in addition to the terminal 32 connected to the output terminal 16 of the series arm 9, a pair of terminals used for the connection with the inductor L5 in such a manner that the pair of terminals are placed before and after the series arm resonator S4b.

In contrast, in the present preferred embodiment, the series arm resonator S4b is directly connected to the output terminal 16 of the series arm 9. Thus, the terminal 32 connected to the output terminal 16 of the series arm 9 and one of the pair of terminals used for the connection with the inductor L5 can be commonly used. The number of terminals required in the transmitting filter chip 20 can therefore be reduced. Consequently, the structure of the transmitting filter 11 can be simplified.

In the following, a more detailed description will be given of specific examples.

Figure 6:
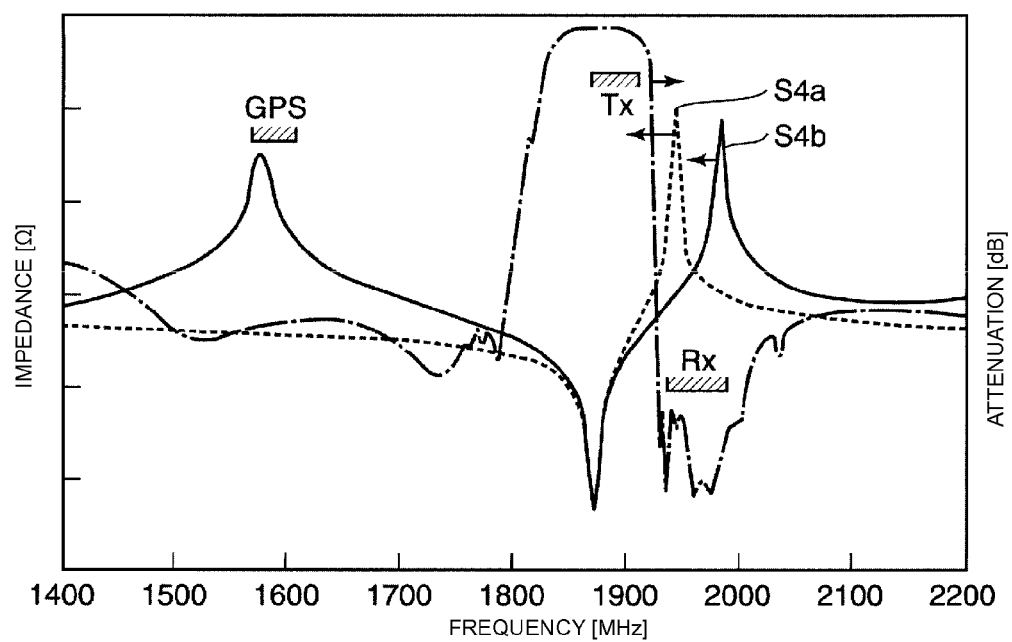
FIG. 6 is a graph showing filter characteristics of a transmitting filter and impedance characteristics of series arm resonators S4a and S4b according to a preferred embodiment of the present invention.
Figure 7:
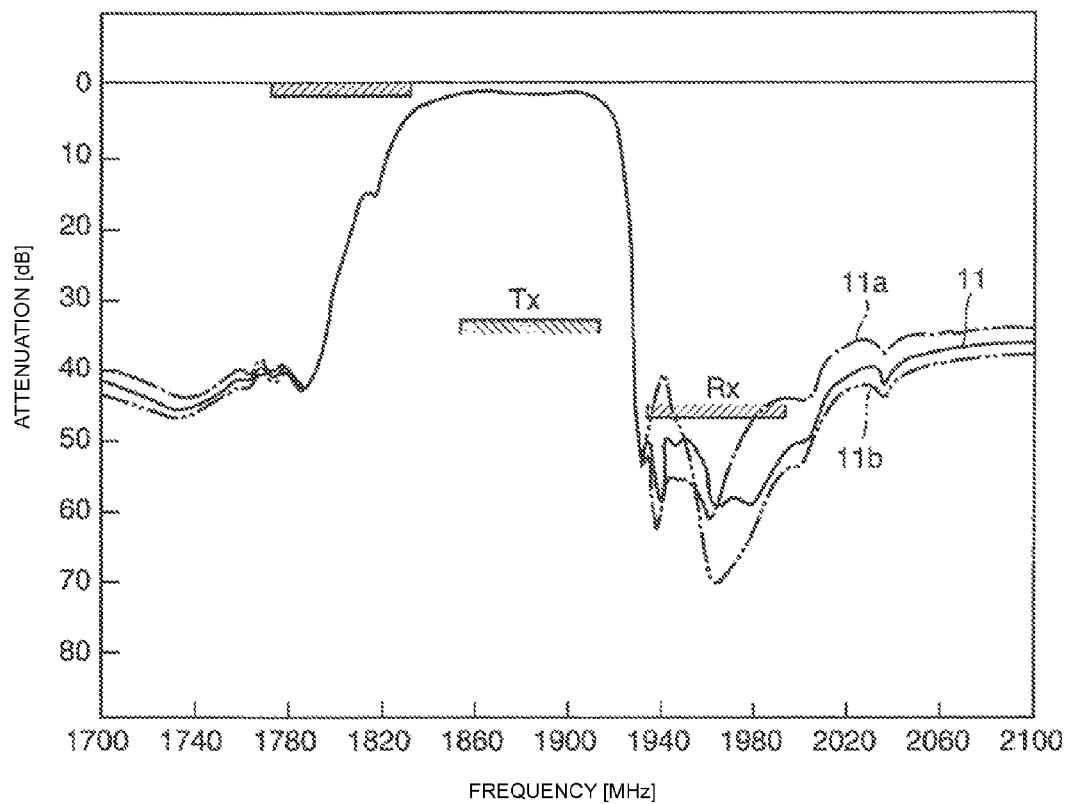
FIG. 7 is a graph showing filter characteristics of the transmitting filter according to a preferred embodiment of the present invention and transmitting filters of Reference Examples 1 and 2.
Figure 8:
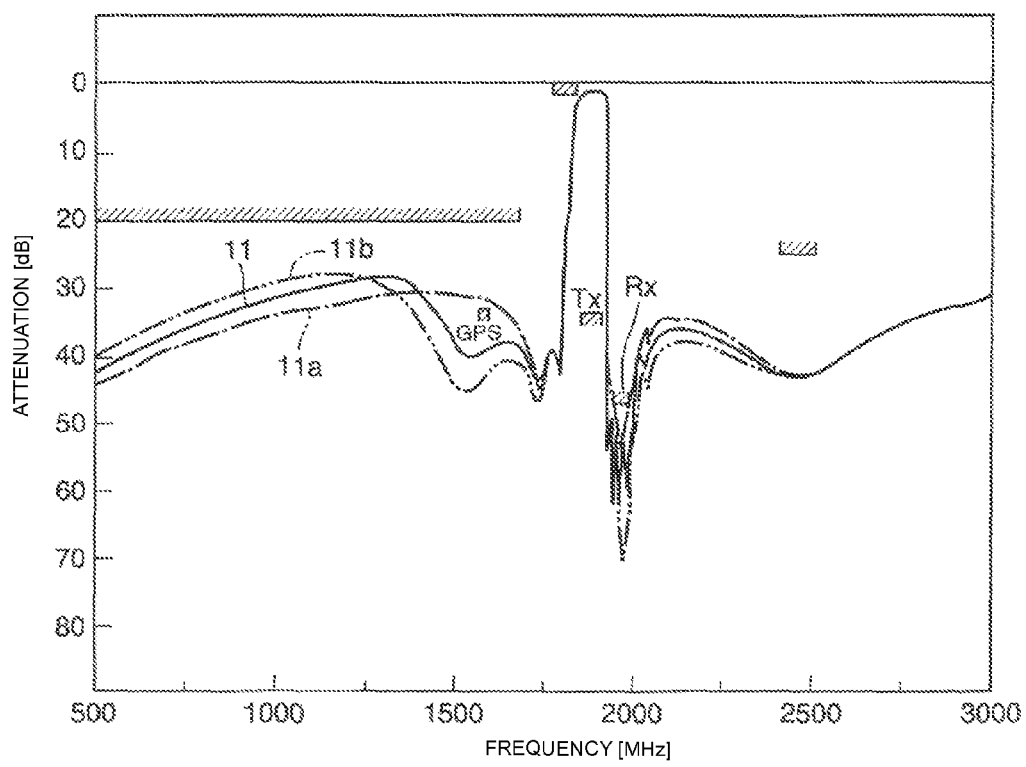
FIG. 8 is a graph showing filter characteristics of the transmitting filter according to a preferred embodiment of the present invention and the transmitting filters of Reference Examples 1 and 2.
Figure 9:
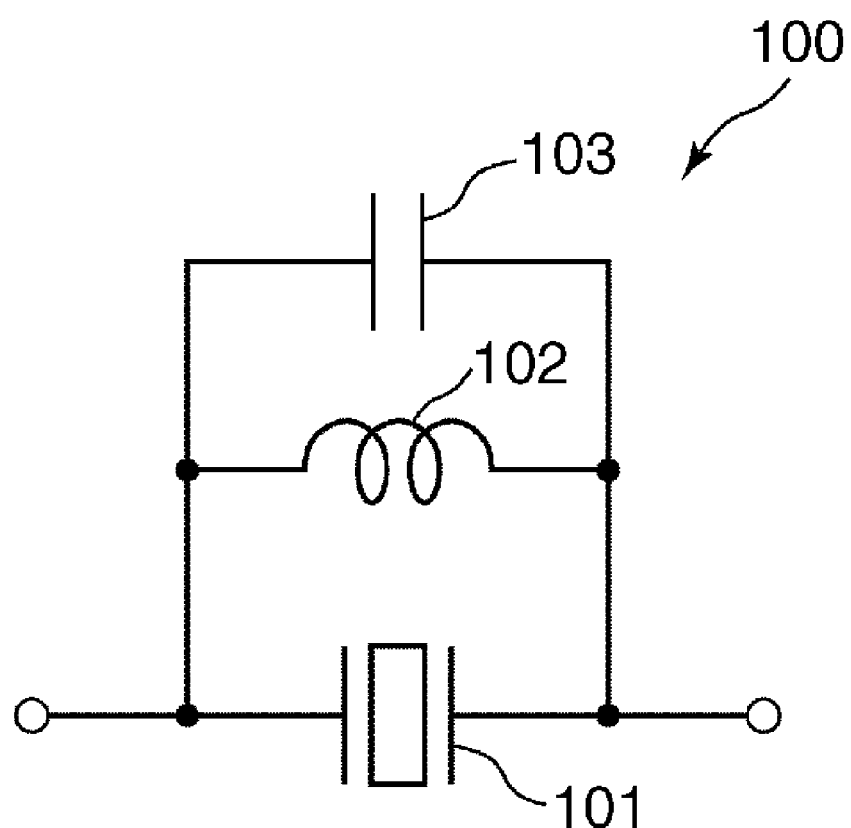
FIG. 9 is a structural diagram of a resonator device disclosed in Japanese Unexamined Patent Application Publication No. 2007-36856.
Figure 10:
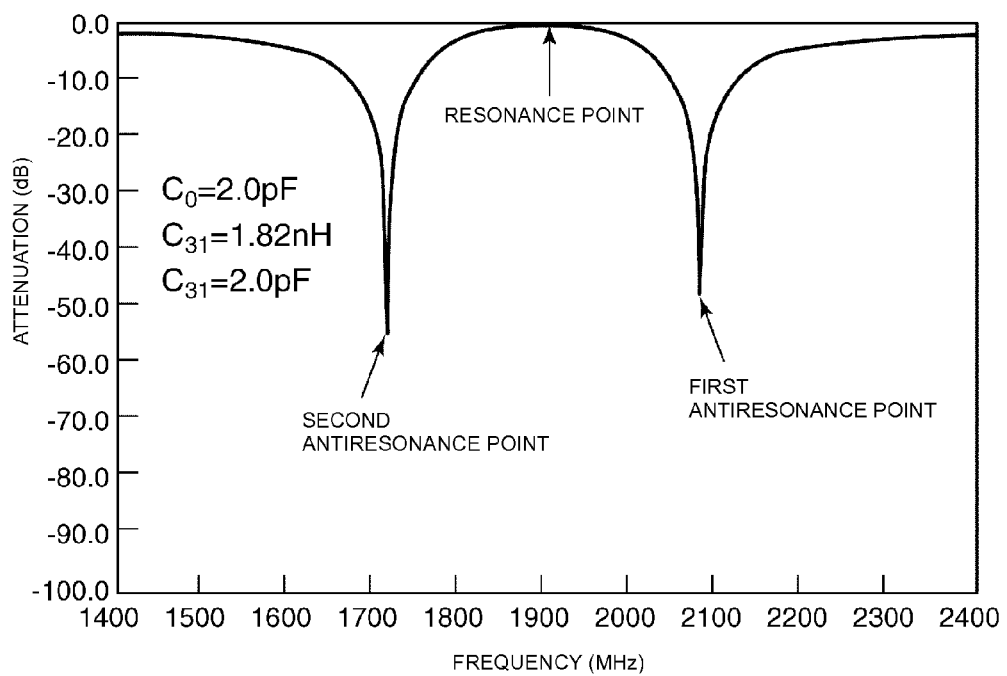
FIG. 10 is a graph showing the transmission characteristics of the resonator device disclosed in Japanese Unexamined Patent Application Publication No. 2007-36856.

FIG. 6 is a graph showing filter characteristics of the transmitting filter 11 and impedance characteristics of the series arm resonators S4a and S4b according to an example of the present preferred embodiment. FIGS. 7 and 8 are graphs showing filter characteristics of the transmitting filter 11.

The design parameters of individual resonators in FIGS. 6 to 8 are provided in Table 1 below. Further, a LiNbO$_3$ substrate having a cut angle of 126° was used as the piezoelectric substrate of the transmitting filter 11. The IDTs and grating reflectors were formed of a laminate of a NiCr film (10 nm) defined on the piezoelectric substrate, a Cu film (80 nm) defined on the NiCr film, and an Al film (10 nm) defined on the Cu film. A SiO$_2$ film having a layer thickness of 110 nm was defined on the piezoelectric substrate so as to cover the IDTs and the grating reflectors, on which a SiO$_2$ film having a thickness of 500 nm was provided. The inductance of the inductor L5 was 1.2 nH and the capacitance of the capacitor C2 was 3.4 pF.

TABLE 1

| Resonator | Number of reflectors | Duty ratio | Aperture Length (μm) | Number of Pairs | λ (μm) |
|---|---|---|---|---|---|
| S1a | 20 | 0.5 | 32 | 158 | 1.8712 |
| S1b | 20 | 0.5 | 32 | 158 | 1.8712 |
| P1a | 20 | 0.5 | 50 | 160 | 1.9550 |
| P1b | 20 | 0.5 | 50 | 160 | 1.9550 |
| S2a | 20 | 0.5 | 48 | 190 | 1.8851 |
| S2b | 20 | 0.5 | 48 | 190 | 1.8851 |
| S2c | 20 | 0.5 | 27 | 131 | 1.8732 |
| P2a | 20 | 0.5 | 46 | 152 | 1.9510 |
| P2b | 20 | 0.5 | 46 | 152 | 1.9510 |
| S3a | 20 | 0.5 | 45 | 150 | 1.8745 |
| S3b | 20 | 0.5 | 45 | 150 | 1.8745 |
| P3a | 20 | 0.5 | 52 | 107 | 1.9470 |
| P3b | 20 | 0.5 | 52 | 107 | 1.9470 |

TABLE 1-continued

| Resonator | Number of reflectors | Duty ratio | Aperture Length (μm) | Number of Pairs | λ (μm) |
|---|---|---|---|---|---|
| S4a | 20 | 0.5 | 32 | 252 | 1.8840 |
| S4b | 20 | 0.5 | 37 | 252 | 1.8840 |

Figure 4:
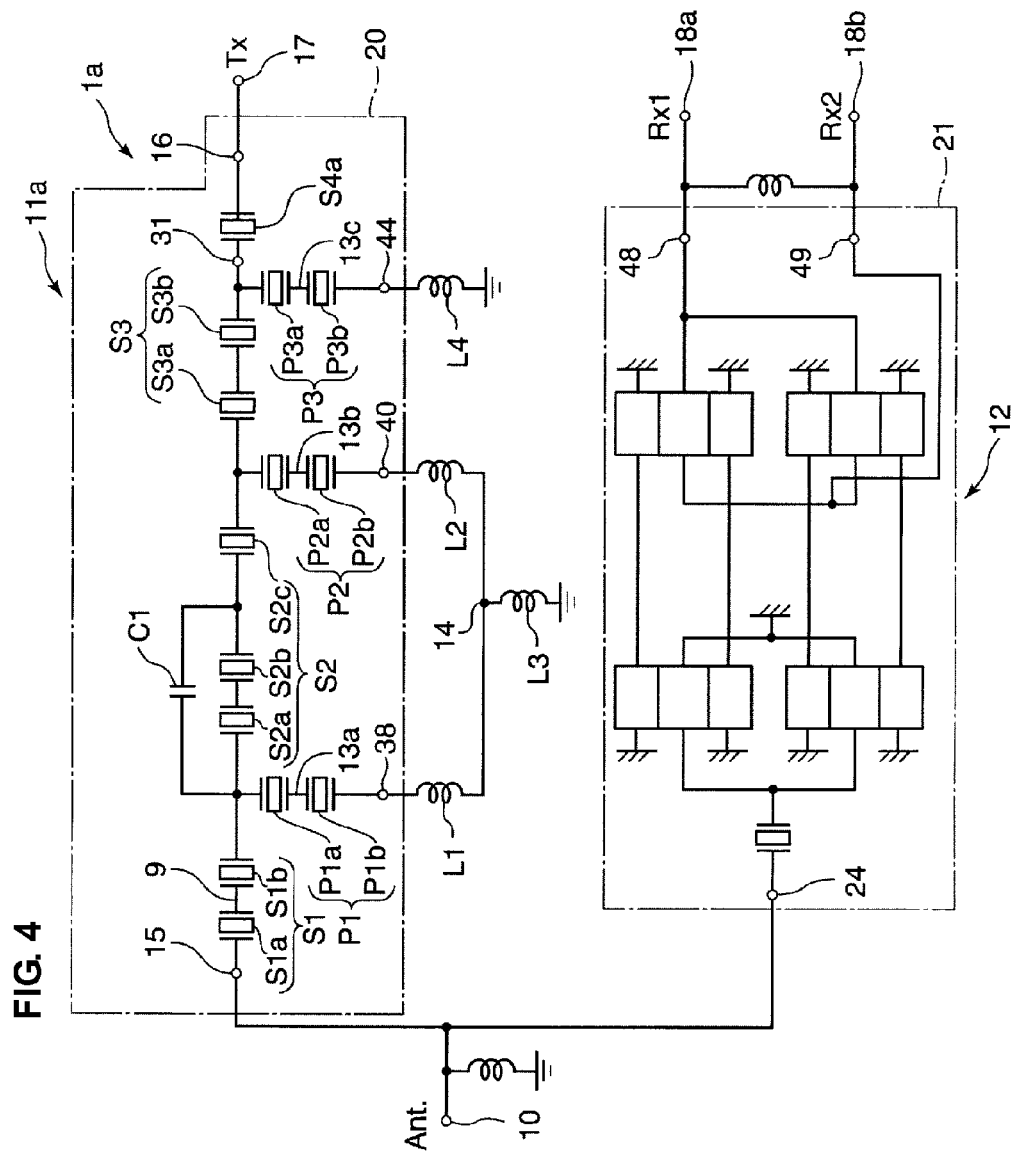
FIG. 4 is a circuit diagram of a duplexer according to a Reference Example 1.

A duplexer 1a having a structure shown in FIG. 4 was fabricated as Reference Example 1. The duplexer 1a has a structure similar to the duplexer 1 shown in FIG. 1, except for a transmitting filter 11a. The transmitting filter 11a is not provided with the series arm resonator S4b, inductor L5, and capacitor C2 shown in FIG. 1.

Figure 5:
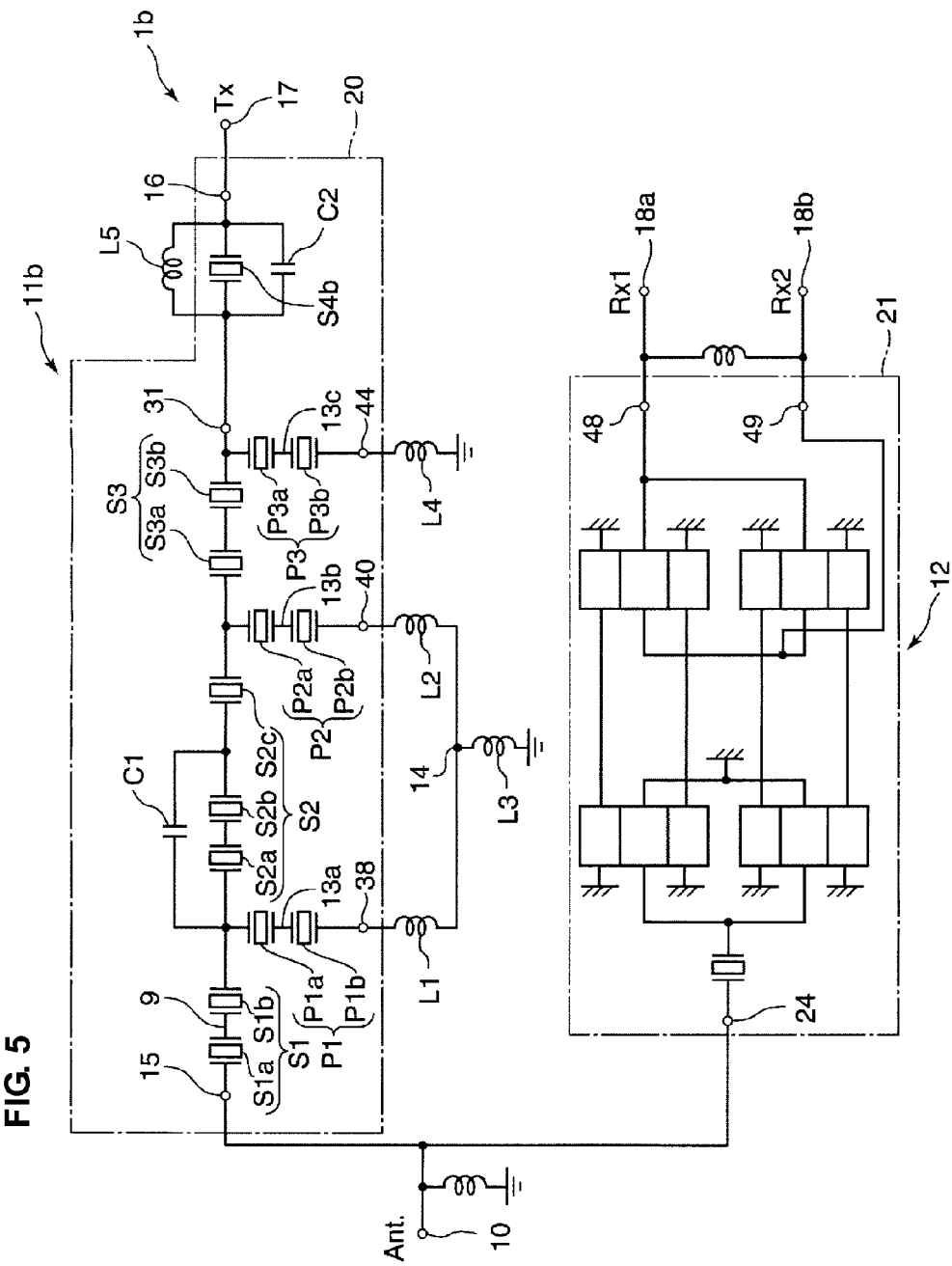
FIG. 5 is a circuit diagram of a duplexer according to a Reference Example 2.

A duplexer 1b having a structure shown in FIG. 5 was fabricated as Reference Example 2. The duplexer 1b has a structure similar to the duplexer 1 shown in FIG. 1, except for a transmitting filter 11b. The transmitting filter 11b is not provided with the series arm resonator S4a shown in FIG. 1, and is different from the transmitting filter 11 shown in FIG. 1 in terms of the aperture length of the series arm resonator S4b, the inductance of the inductor L5, and the capacitance of the capacitor C2. The aperture length of the series arm resonator S4b in the transmitting filter 11b is made smaller than the aperture length of the series arm resonator S4b in the transmitting filter 11 according to the present preferred embodiment so that the capacitance of the series arm resonators S4b and S4a in the present preferred embodiment becomes equal to the capacitance of the series arm resonator S4b in Reference Example 2. Further, the inductance of the inductor L5 was 2.4 nH and the capacitance of the capacitor C2 was 1.7 pF.

FIGS. 7 and 8 show filter characteristics of the transmitting filters 11, 11a, and 11b. In FIGS. 7 and 8, a graph indicated by a solid line shows the filter characteristics of the transmitting filter 11 of the present preferred embodiment, which is represented by reference numeral 11. A graph indicated by a one-dot chain line shows the filter characteristics of the transmitting filter 11a of Reference Example 1, which is represented by reference numeral 11a. A graph indicated by a two-dot chain line shows the filter characteristics of the transmitting filter 11b of Reference Example 2, which is represented by reference numeral 11b.

Table 2 below shows the resonance frequencies and anti-resonance frequencies of the series arm resonators S4a and S4b.

TABLE 2

| Transmitting filter 11 | Series arm resonator S4a | Resonance frequency (MHz) | 1870 |
|---|---|---|---|
| | | Anti-resonance frequency (MHz) | 1935 |
| | Series arm resonator S4b | Resonance frequency (MHz) | 1870 |
| | | Low-frequency-side anti-resonance frequency (MHz) | 1530 |
| | | High-frequency-side anti-resonance frequency (MHz) | 1970 |
| Transmitting filter 11a | Series arm resonator S4a | Resonance frequency (MHz) | 1870 |
| | | Anti-resonance frequency (MHz) | 1935 |
| Transmitting filter 11b | Series arm resonator S4b | Resonance frequency (MHz) | 1870 |
| | | Low-frequency-side anti-resonance frequency (MHz) | 1530 |
| | | High-frequency-side anti-resonance frequency (MHz) | 1970 |

As shown in Table 2 above and also in FIG. 6, in the present preferred embodiment, both the anti-resonance frequency (1935 MHz) of the series arm resonator S4a and the high-frequency-side anti-resonance frequency (1970 MHz) of the series arm resonator S4b are located in the Rx band (1930 to 1990 MHz). Thus, as shown in FIGS. 6 to 8, a high attenuation was attained in both a high-frequency region and low-frequency region of the Rx band (1930 to 1990 MHz).

In contrast, in the transmitting filter 11a that is not provided with the series arm resonator S4b, the inductor L5, or the capacitor C2, as shown in FIGS. 7 and 8, the resonance frequency of the series arm resonator S4a is 1935 MHz and no anti-resonance point is present in a frequency range higher than 1935 MHz. Thus, the attenuation in a low-frequency region of the Rx band was large while the attenuation in a high-frequency region of the Rx band was smaller than that of the transmitting filter 11. Consequently, when portions of the transmitting filters 11 and 11a that showed the smallest attenuation in the Rx band were compared, the attenuation of the transmitting filter 11 was about 5 dB greater than that of the transmitting filter 11a.

Further, in the transmitting filter 11b that is not provided with the series arm resonator S4a, the high-frequency-side anti-resonance frequency of the series arm resonator S4b is 1970 MHz and no anti-resonance point is present in a frequency range lower than 1970 MHz. Thus, the attenuation in a high-frequency region of the Rx band was large while the attenuation in a low-frequency region of the Rx band was smaller than that of the transmitting filter 11. Consequently, when portions of the transmitting filters 11 and 1ib that showed the smallest attenuation in the Rx band were compared, the attenuation of the transmitting filter 11 was about 8 dB greater than that the transmitting filter 11b.

Furthermore, in the present preferred embodiment, the anti-resonance frequency (1530 MHz) of the series arm resonator S4b is located near the GPS band (1550 to 1600 MHz). Thus, as shown in FIGS. 6 to 8, a large attenuation was attained in the GPS band.

In contrast, since the transmitting filter 11a is not provided with the series arm resonator S4b, the inductor L5, or the capacitor C2, no anti-resonance point is present near the GPS band. Therefore, the attenuation in the GPS band was reduced. Specifically, when portions of the transmitting filters 11 and 11a that showed the smallest attenuation in the GPS band were compared, the attenuation of the transmitting filter 11 was about 7 dB greater than that of the transmitting filter 11a.

Therefore, it can be understood that the attenuation characteristics in both the Rx band and the GPS band can be improved by providing the transmitting filter 11 with both the series arm resonator S4b in which each of the inductor L5 and the capacitor C2 is connected in parallel and the series arm resonator S4a in which no inductor or capacitor is connected in parallel.

In the foregoing preferred embodiment, a description has been given of an example in which the transmitting filter 11 includes a series arm resonator having an inductor and a capacitor connected in parallel therewith and a series arm resonator having no inductor or capacitor connected in parallel therewith. However, the present invention is not limited to the structure of this example. For example, a receiving filter may include a series arm resonator having an inductor and a capacitor connected in parallel therewith and a series arm resonator having no inductor or capacitor connected in parallel therewith.

Further, the foregoing preferred embodiments have been described in the context of a ladder filter by way of example. However, any suitable filter other than a ladder filter may be applied to the present invention. A filter of the present invention may be, for example, a longitudinally coupled resonator filter.

In the foregoing preferred embodiments, a description has been given of an example in which a single resonator having an inductor and a capacitor connected in parallel therewith and a single resonator having no inductor or capacitor connected in parallel therewith are provided. However, the present invention is not limited to the structure of this preferred embodiment. For example, at least a plurality of resonators each having an inductor and a capacitor connected in parallel therewith or a plurality of resonators each having no inductor or capacitor connected in parallel therewith may be provided.

In the foregoing preferred embodiment, a description has been given of an example in which each of the series arm resonator devices S1, S2, and S3 and the parallel arm resonator devices P1, P2, and P3 include two or three resonators. However, the present invention is not limited to the structure of this embodiment. Each of the series arm resonator devices S1, S2, and and the parallel arm resonator devices P1, P2, and P3 may be formed of a single resonator or a plurality of resonators.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A filter comprising:
   an input terminal;
   an output terminal;
   a series arm connected between the input terminal and the output terminal;
   a plurality of series arm resonator devices connected to the series arm, at least one of the plurality of series arm resonator devices being defined by a plurality of series arm resonators;
   a plurality of parallel arms connected between the series arm and a ground potential and a plurality of parallel arm resonators provided in each of the plurality of parallel arms;
   an inductor; and
   a capacitor; wherein
   the inductor and the capacitor are connected in parallel with at least one of the plurality of series arm resonators;
   at least another one of the plurality of series arm resonators, except for the at least one of the plurality of series arm resonators, includes no inductor or capacitor connected in parallel therewith.

2. The filter according to claim 1, wherein the filter is a ladder filter.

3. A duplexer comprising the filter according to claim 1, wherein the filter defines a transmitting filter.

4. The duplexer according to claim 3, further comprising:
   a wiring substrate including the inductor and a transmitting signal terminal of the transmitting filter; and
   a transmitting filter chip flip-chip mounted on the wiring substrate and including at least a portion of the transmitting filter including the plurality of series arm resonator devices, the transmitting filter chip including a filter-chip terminal connected to the transmitting signal terminal; wherein
   the at least one of the plurality of series arm resonators including the inductor and the capacitor connected in parallel therewith is directly connected to the filter-chip terminal.

* * * * *